United States Patent [19]

Lee et al.

[11] Patent Number: 5,732,029
[45] Date of Patent: Mar. 24, 1998

[54] METHOD AND CIRCUIT FOR TESTING MEMORY CELLS IN SEMICONDUCTOR MEMORY DEVICE

[75] Inventors: Sang-Kil Lee; Yong-Sik Seok, both of Suwon, Rep. of Korea

[73] Assignee: Samsung Electronics Co., Ltd., Suwon, Rep. of Korea

[21] Appl. No.: 650,398

[22] Filed: May 20, 1996

[30] Foreign Application Priority Data

May 20, 1995 [KR] Rep. of Korea ............... 12690/1995

[51] Int. Cl.⁶ ............................................. G11C 7/00
[52] U.S. Cl. ........................ 365/200; 365/201; 365/225.7
[58] Field of Search ............................ 365/200, 201, 365/225.7

[56] References Cited

U.S. PATENT DOCUMENTS

| | | | |
|---|---|---|---|
| 5,113,371 | 5/1992 | Hamada | 365/200 |
| 5,343,429 | 8/1994 | Nakayama et al. | 365/200 |
| 5,357,470 | 10/1994 | Namekawa et al. | 365/200 |
| 5,373,471 | 12/1994 | Saeki et al. | 365/200 |
| 5,469,388 | 11/1995 | Park | 365/200 |

*Primary Examiner*—David C. Nelms
*Assistant Examiner*—Hien Nguyen
*Attorney, Agent, or Firm*—Marger, Johnson, McCollom & Stolowitz, PC

[57] ABSTRACT

A test control circuit and method of testing a memory cell in a semiconductor memory device. The test control circuit includes a memory cell array having a plurality of normal memory cells to store data on a semiconductor substrate and a plurality of redundancy memory cells to substitute for defective normal memory cells. Row and column redundancy fuse boxes include fuse elements to be electrically fused to enable row and column redundancy decoders for selecting rows and columns of the redundancy memory cells. A redundancy cell test signal generator generates, in response to a test signal applied to an extra line in the address bus, a master clock for testing the redundancy memory cell under the same mode as a test mode of the normal memory cell. A test controller provides an enable signal for selecting the redundancy memory cells of a memory array in response to logic levels of the master clock and an address signal applied during the redundancy memory cell test.

10 Claims, 7 Drawing Sheets

METHOD AND CIRCUIT FOR TESTING MEMORY CELLS IN SEMICONDUCTOR MEMORY DEVICE

BACKGROUND OF THE INVENTION

1. Field of the Invention

The present invention relates to a test control circuit and method of testing memory cells in a semiconductor memory device and more particularly to a test control circuit and method capable of simultaneously testing a redundancy memory cell and a normal memory cell.

The present application is based on Korean Application No. 12690/1995 which is incorporated herein by reference for all purposes.

2. Description of the Related Art

To ensure the reliability of a semiconductor memory, manufactures generally perform a variety of tests on completed memory devices, both in a wafer state and in a packaged state. Currently, the time required to complete this testing is relatively large compared to the time for producing the memory devices. This increased testing time leads to a corresponding increase in the amount of resources used in testing, e.g., equipment, labor and so on. The added time and resources required for testing ultimately increase both the final cost and the final speed of production of the memory device.

To solve the foregoing problems, JEDEC (Joint Electron Device Engineering Council) has proposed standardized test methods for a typical dynamic memory. One of these test methods is a parallel test mode. This testing is performed under a timing scheme referred to as /W & /C before /R before (WCBR) mode. The parallel mode commences with the WCBR condition and reduces the test time by simultaneously performing tests throughout a plurality of bits in a read/write operation for cells provided within the semiconductor memory device. A signal /R used in the above represents a row address strobe signal /RAS and a signal /C represents a column address strobe signal /CAS. A signal /W represents a write signal.

An example of this parallel test method, known to those skilled in the art, is disclosed in Masaki Kumanoya, et al., "A 90 ns IMb DRAM with Multi-bit Test Mode", pp. 240-241, "1985 IEEE INTERNATIONAL SOLID-STATE CIRCUITS CONFERENCE DIGEST OF TECHNICAL PAPERS".

In the meantime, conventional memory cell tests are performed on each of the normal memory cells and the redundancy memory cells with the redundancy array being tested separately from the normal array. The redundancy memory cells are used to replace a normal memory cell which is indicated as defective during testing. A prior art test circuit for a 64 megabyte dynamic random access ram (DRAM) is shown in FIG. 1. The semiconductor memory device is composed of a memory cell array 400 having a plurality of normal and redundancy memory cells, a column decoder 330 connected to column lines of the normal memory cell within the memory cell array 400, and a row decoder 270 connected to row lines of the normal memory cell. Column and row redundancy decoders 230 and 260 are each connected to the column and row lines, respectively, of the redundancy memory cell within the memory cell array 400. Row and column address buffers 290 and 310 are each connected to an address buffer 280. A row predecoder 300 is connected to the row address buffer 290 and the row decoder 270. A column predecoder 320 is connected to the column address buffer 310 and the column decoder 330. A row redundancy fuse box 250 receives a signal from a row redundancy cell test pad 240 and an address from the row address buffer 290. Row redundancy fuse box 250 supplies a row test signal to the row redundancy decoder 260. A column redundancy fuse box 210 receives a signal from a column redundancy cell test pad 200 and an address from the column address buffer 310. Column redundancy fuse box 250 supplies a column test signal to the column redundancy decoder 230.

As shown in FIG. 1, testing normal memory cell array is performed by addressing all the cells in the array between the most significant bit address (MSB) A12 and the least significant bit address (LSB) A0. On the other hand, the test of the redundancy memory cell is performed by the redundancy cell test pad. That is, the row redundancy cell test pad signal PRTRE, shown in a block 240 of FIG. 3, and the column redundancy cell test pad signal PRTCE, shown in another block 200 of FIG. 2, are preset to test the redundancy memory cell array by disabling a word line and a column selection line of a normal memory cell corresponding to each address, and also enabling the word line and the column selection line of the corresponding redundancy memory cell. The signals PRTRE and PRTCE are generated by application of power supply voltage $V_{cc}$ to the row redundancy cell test pad PRTRE and the column redundancy cell test pad PRTCE.

Referring to FIGS. 2 and 3, the test of the redundancy cell array is explained in more detail hereinafter. FIG. 2 is a diagram illustrating the column redundancy fuse box 210 of FIG. 1 and the column redundancy cell test pad part 200. As a master clock for the column redundancy cell test, a signal PRTC produced in the column redundancy cell test pad part 200 is generated by operation of inverters 200C and 200D and transistors 200A and 200B. The drain terminals, source terminals, and channels of transistors 200A and 200B are connected in series in between an input terminal of the cell test pad PRTCE and the ground voltage.

Such a generation clock signal PRTC is provided to one terminal of a NAND gate 211A within a signal generator 211 and is then used for making a redundancy enable signal RENi for enabling the redundancy memory cell, together with a column address signal Dcajkl for selecting one of 8 redundancy column selection lines. The redundancy enable signal RENi disables the column selection line of the normal memory cell and also enables the column selection line of the redundancy memory cell. Thus, when a driving pulse RSTP generated by the row address strobe signal is applied to the fuse box 210 of FIG. 2 and the column selection line of the redundancy memory cell is also enabled, the column part of the redundancy memory cell is designated for testing.

FIG. 3 illustrates structure in the row redundancy fuse box 250 and the row redundancy memory cell test pad part 240 which operates to designate the row part of the redundancy memory cell for testing. As a master clock for row redundancy cell test, another signal PRTR is produced in the row redundancy memory cell test pad part 240 by operation of the inverters 200C and 200D and the transistors 200A and 200B. The drain terminals, source terminals, and channels of transistors 200A and 200B are in series connected in between the input terminal of the cell test pad PRTRE and the ground voltage. Such a generation clock signal PRTR is used together with a row address signal DRAjkl to generate a redundancy enable signal REDi within a signal generator 251 for selecting one of 8 redundancy row selection lines. The redundancy enable signal REDi disables the row selection line of the normal memory cell and also enables the row selection line of the redundancy memory cell. Thus, when the driving pulse RSTP generated by the row address strobe signal is applied to fuse box 250 of FIG. 3 and the row selection line of the redundancy memory cell is also enabled, the row part of the redundancy memory cell is designated for testing.

As discussed above, the memory cell test according to the prior art has been independently and separately achieved in the normal memory cell and the redundancy memory cell, so that two test modes have been separately provided and the test operation has been executed twice. This causes long testing time and associated higher costs.

Also, it is difficult to test the memory cell having the normal memory cell and the redundancy memory cell. That is, in case that the bridge is generated in the bit lines of the normal memory cell and the redundancy memory cell, the normal memory cell is blocked in performance of the redundancy memory cell. This makes it difficult to screen and detect defective memory cells.

SUMMARY OF THE INVENTION

It is, therefore, an object of the invention to provide a memory cell test control circuit and method for a semiconductor memory device capable of solving problems in the prior art.

It is another object of the invention to provide a test control circuit and method capable of testing a memory cell array having normal and redundancy memory cells in a semiconductor memory device.

It is yet another object of the invention to provide a circuit and method capable of reducing the time required to complete testing of memory devices and detecting defective memory cells between a normal memory cell and a redundancy memory cell adjacent to each other.

It is still yet another object of the invention to provide a semiconductor memory device capable of testing a normal memory cell and a redundancy memory cell under a single test mode.

In order to achieve the above objects according to the present invention, a memory cell test circuit for a semiconductor memory device having a memory cell array including a first array of normal memory cells and a second array of redundant memory cells, includes an address bus for applying row and column addresses to the memory device. The address bus includes a line having a signal thereon for selecting between the first and second arrays. The bus line is operatively connected to a logic circuit which enables the first array and disables the second array when a signal on the bus line is in a first logic state. The logic circuit enables the second array and disables the first array when the signal is in a second logic state.

BRIEF DESCRIPTION OF THE DRAWINGS

The above and other objects, advantages and features of the present invention will be more apparent from the following detailed description taken with the attached drawings in which.

DETAILED DESCRIPTION OF THE PREFERRED EMBODIMENT

Figure 1:
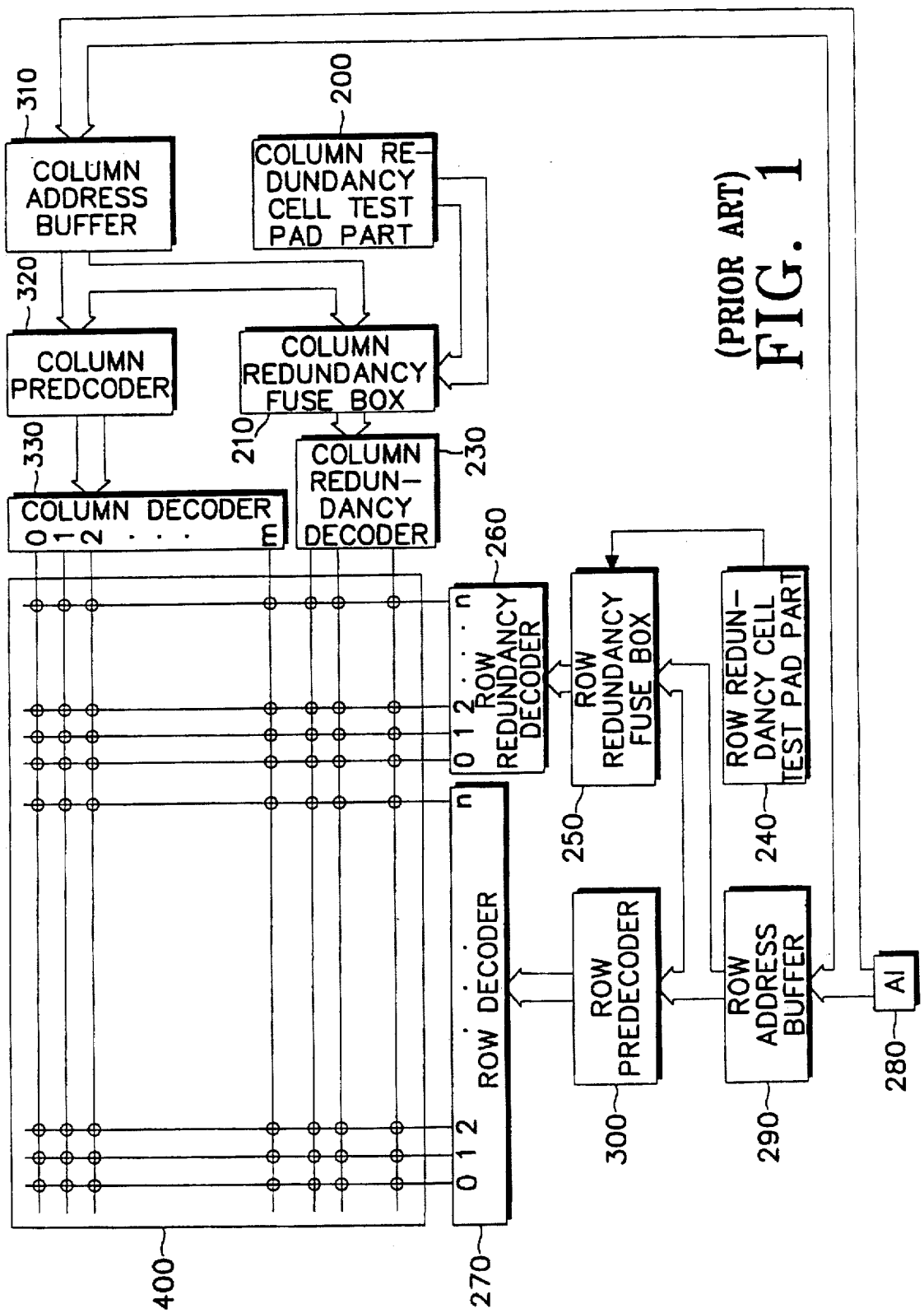
FIG. 1 is a block diagram of a semiconductor memory device having a test control circuit according to the prior art.
Figure 2:
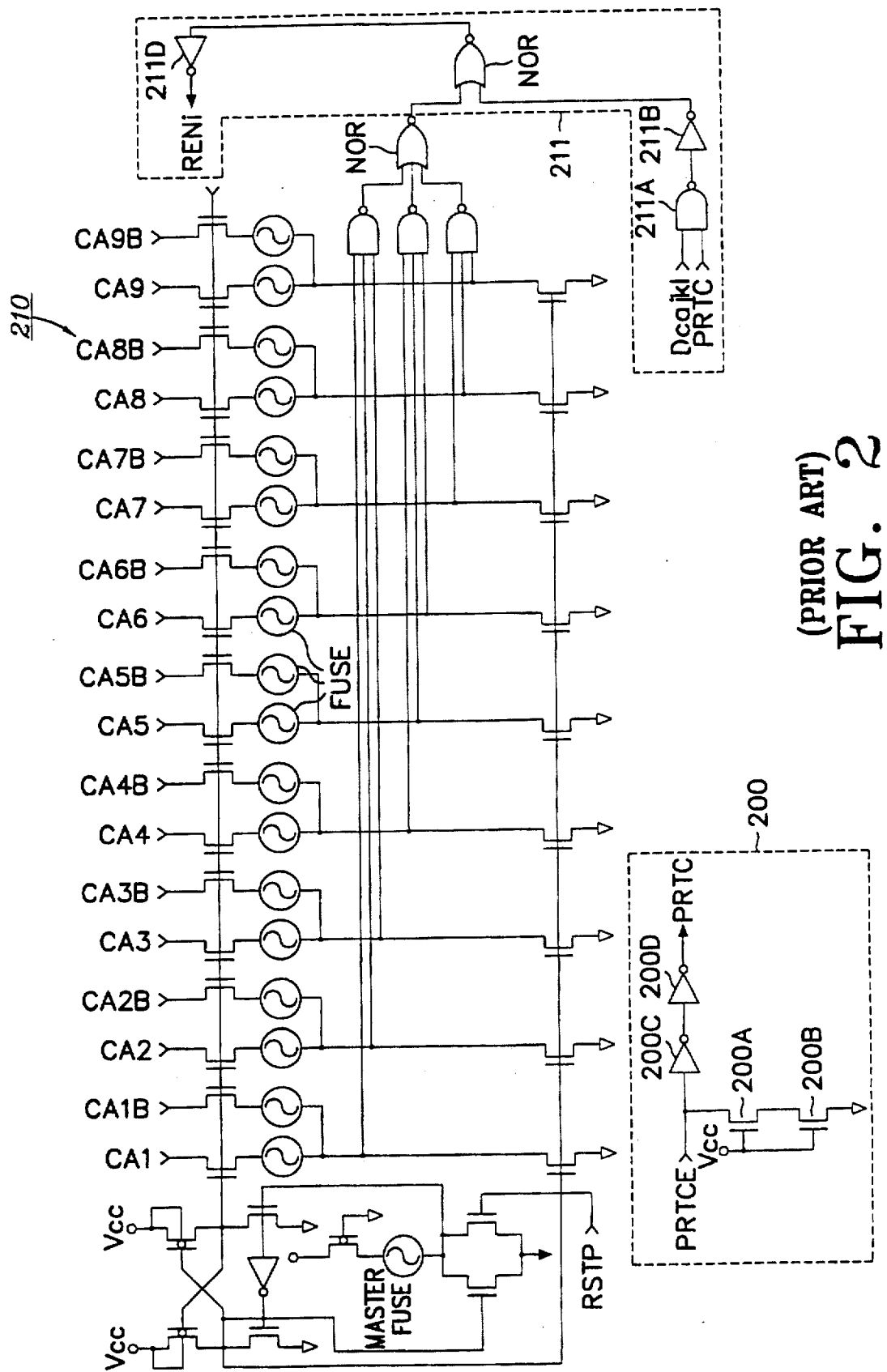
FIGS. 2 and 3 are detailed circuit diagrams of fuse boxes related to a redundancy memory cell test of FIG. 1.
Figure 3:
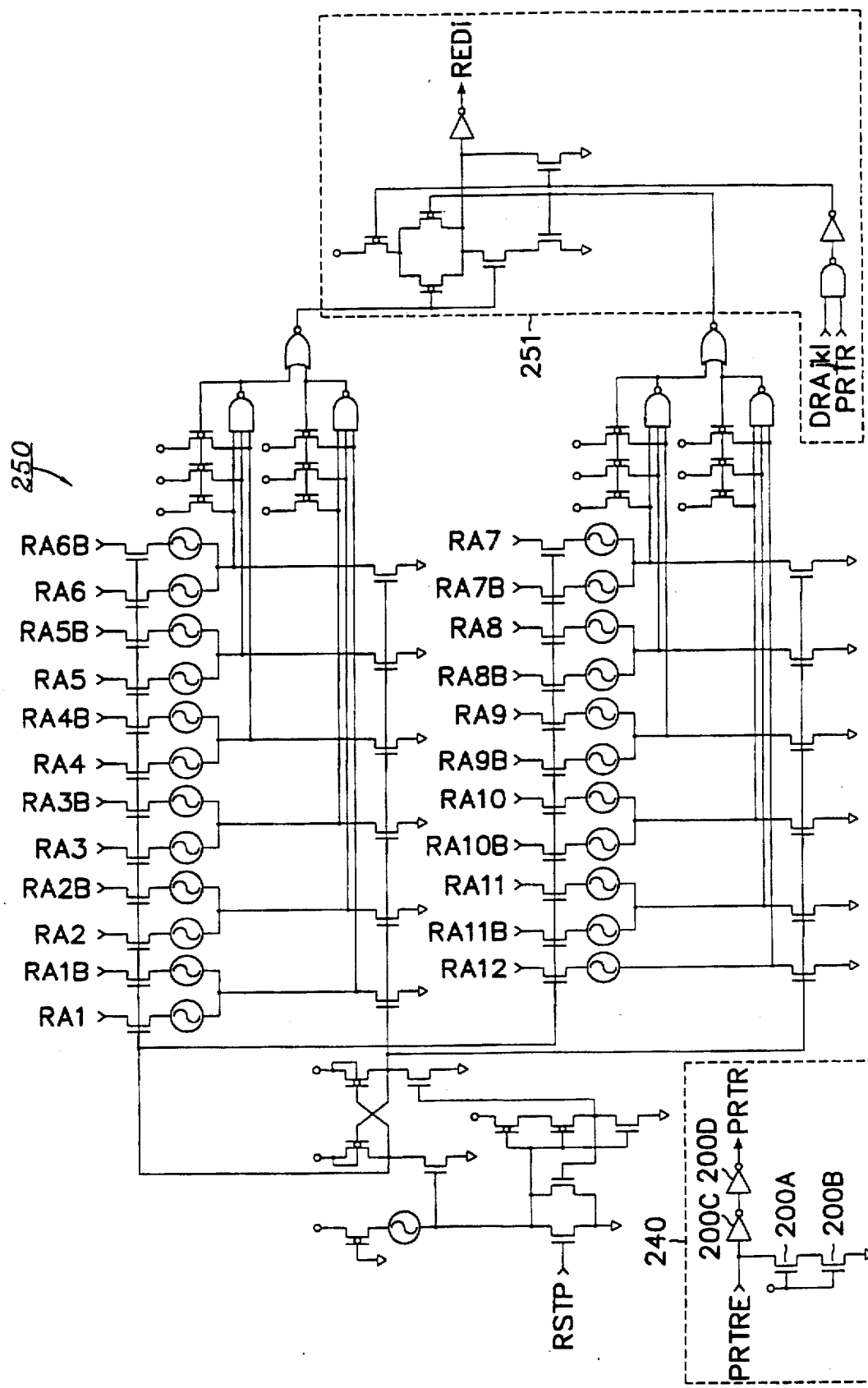

In the following description, the same components are indicated by the same reference numerals. Further, specific details are set forth to provide a more thorough understanding of the present invention. It will be apparent, however, to one skilled in the art, that the present invention may be practiced without these specific details. In other instances, well known features have not been described in detail so as not to obscure the present invention.

Figure 4:
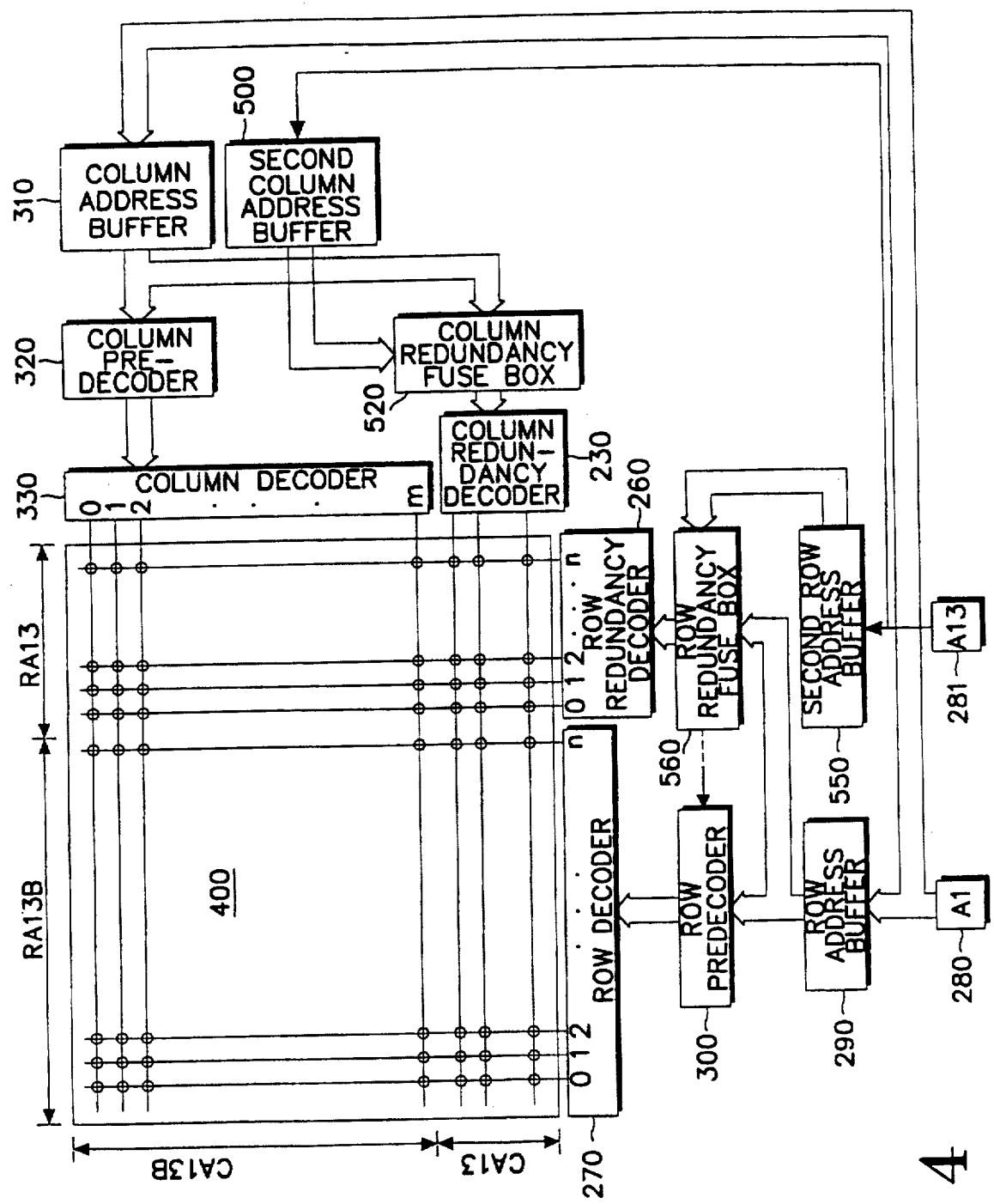
FIG. 4 is a block diagram of a semiconductor memory device having a test control circuit according to the present invention.

FIG. 4 is a block diagram of a semiconductor memory device having a test control circuit according to the present invention. The semiconductor memory device includes a memory cell array 400; column and row decoders 330, 270, respectively; column and row redundancy decoders 230, 260; row and column address buffers 290, 310; a row predecoder and column precoders 300, 320, respectively; second row and column address buffers 550, 500; and row and column redundancy fuse boxes 560, 520.

The memory cell array 400 has a plurality of normal and redundancy memory cells. The column decoder 330 is connected to column lines of the normal memory cell array in memory cell array 400. The row decoder 270 is connected to row lines of the normal memory cell. The column and row redundancy decoders 230, 260 are each connected to the column and row lines of the redundancy memory cell in memory cell array 400. The row and column address buffers 290, 310 are each connected to an address buffer 280. The row predecoder 300 is connected to the row address buffer 290 and the row decoder 270. The column predecoder 320 is connected to the column address buffer 310 and the column decoder 330. The second row and column address buffers 550 and 500 are enabled by the master clock input address signals through a set address bus 281 and by output row and column selection drying signals required in the redundancy memory cell test. The row redundancy fuse box 560 provides to the row redundancy decoder 260 a signal to enable the row line of the cell during the redundancy memory cell test in response to outputs of the second row address buffer 550 and the row address buffer 290. The column redundancy fuse box 520 provides to the column redundancy decoder 230 a signal to enable a column line in the cell during the redundancy memory cell test in response to outputs of the second column address buffer 500 and the column address buffer 310.

As shown, the configuration of FIG. 4 is different from that of FIG. 1 to provide another address signal A13 which is utilized to perform both the normal memory cell and the redundancy memory cell test in a single test mode. That is, the test according to the present invention is executed by performing an address coding in the redundancy memory cell, like in the normal memory cell, by using the fourteenth address signal A13 applied to an external address pin of the memory device to perform a sequential address transition from the least significant bit A0 to the most significant bit A13.

For example, in case of 64 megabyte DRAM, the addresses A0–A12 generally select the normal memory cell. If the address A13 is at the logic "low" level, the normal memory cell is selected. On the other hand, if the address A13 is at the logic "high" level, the redundancy memory cell is selected. Thereby, the test of a desired redundancy memory cell is completed under one test mode. Hence, the present invention does not require the two master clocks as in the prior art so as to achieve the tests of the row and column redundancy cells. Only the fourteenth address A13 is required in the present invention.

Figure 5:
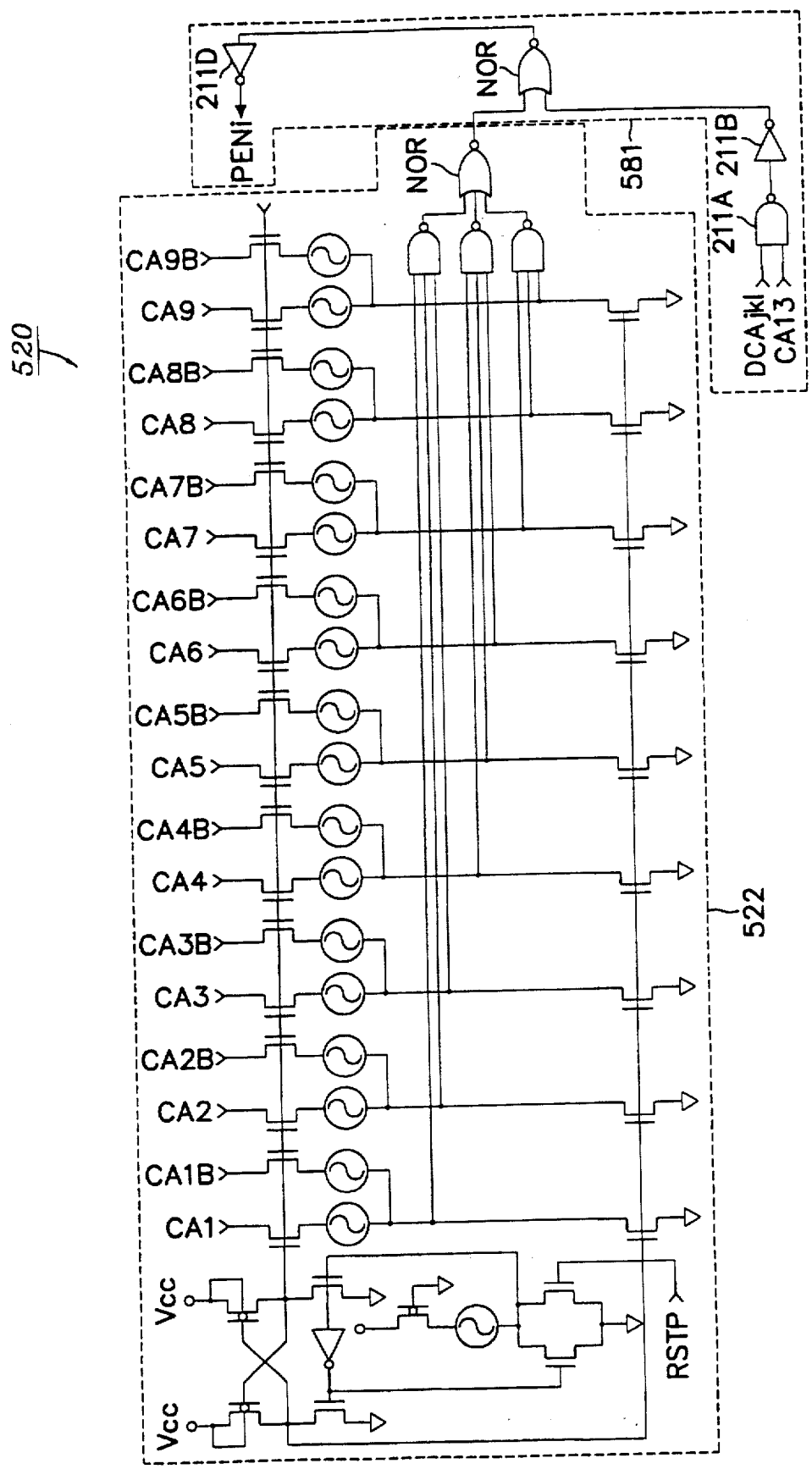
FIGS. 5 and 6 are detailed circuit diagrams of fuse boxes related to a redundancy memory cell test of FIG. 4.
Figure 7:
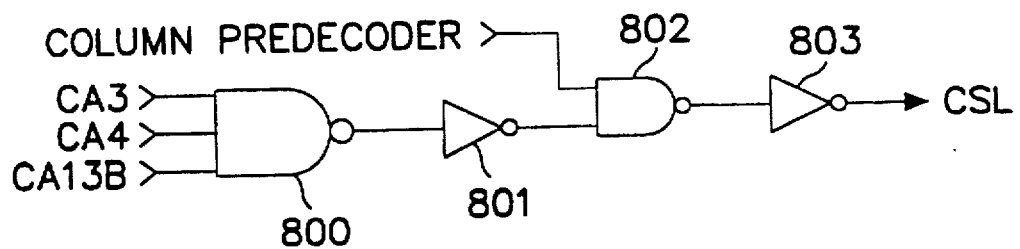
FIGS. 7 and 8 are circuit diagrams illustrating one embodiment of clock generators for generating operating clocks required in each part of FIG. 4.

Meantime, a column address CA13B generated by the second column address buffer 500 is provided to one terminal of a disable signal generator for controlling the column selection line of the normal memory cell shown in FIG. 7. As shown in FIG. 7, if the column address CA13B has the logic "low" level, the column selection line of the normal memory cell is disabled. Moreover, the address signal generates a redundancy enable signal PENi within the column redundancy fuse box of FIG. 5. The redundancy enable signal PENi enables the redundancy column selection line and it is thus possible to perform the column redundancy cell test of the redundancy memory cell.

On the other hand, if the address A13 is applied at the logic "low" level, the column selection line of the normal memory cells is enabled. As shown in signal generator 581 of FIG. 5, a redundancy disable signal PENi disables the redundancy column selection line and it is thus possible to perform the column cell test of the normal memory cell.

Figure 6:
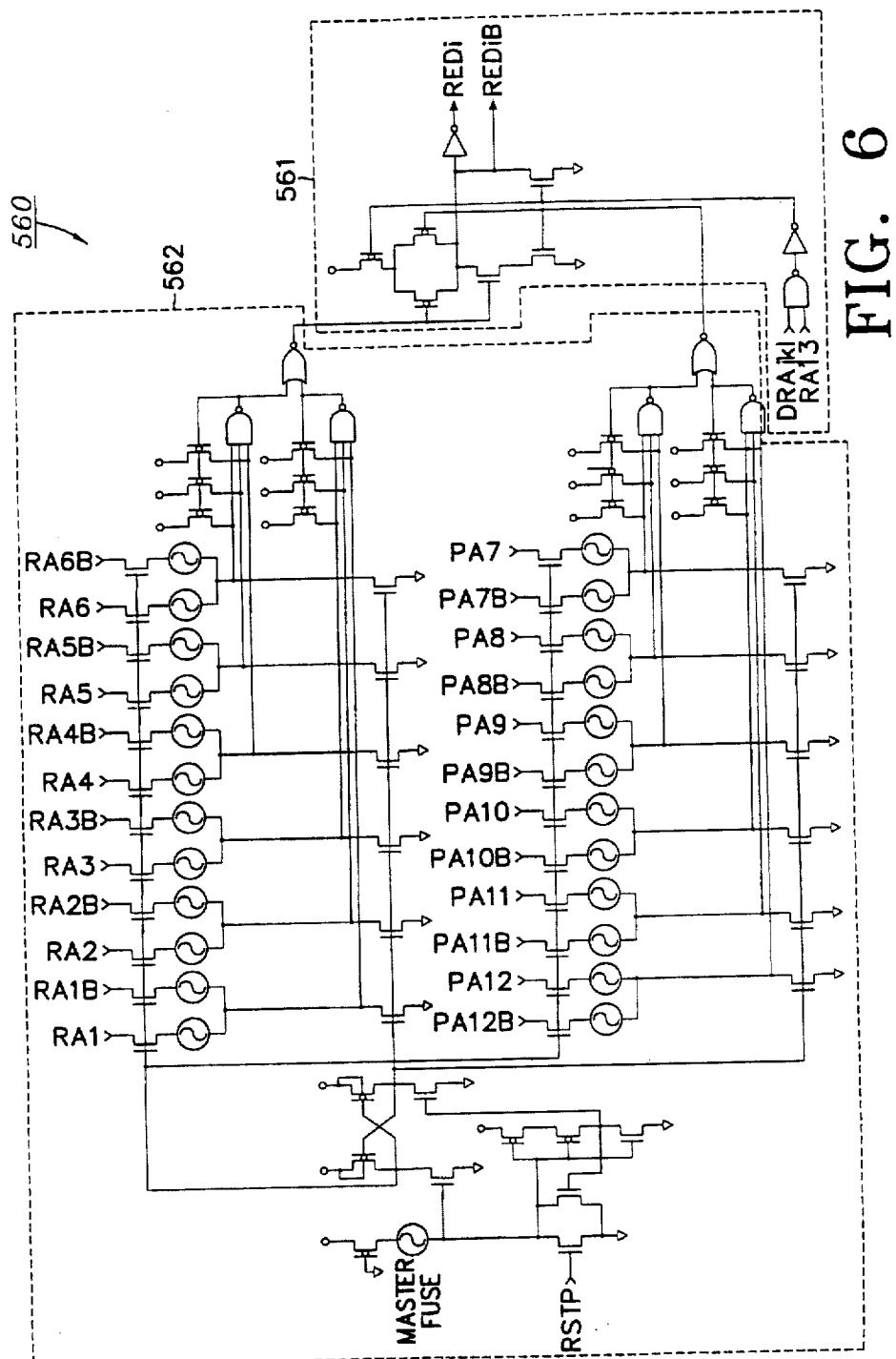

On the other hand, if the fourteenth address signal A13 is applied to the second row address buffer 550 at the logic "high" level, the word line of the normal memory cell is disabled. Moreover, a row address RA13 produced by the row address buffer 550 generates a row redundancy enable signal REDi within the row redundancy fuse box 560 of FIG. 6. The row redundancy enable signal REDi enables the redundancy row selection line and it is thus possible to perform the row redundancy cell test of the redundancy memory cell.

When the address A13 is applied at the logic "low" level, the row selection line of the normal memory cell of the memory cells is enabled. Accordingly, the redundancy enable signal REDi can't be enabled so it is possible to perform the row cell test of the normal memory cell.

Figure 8:
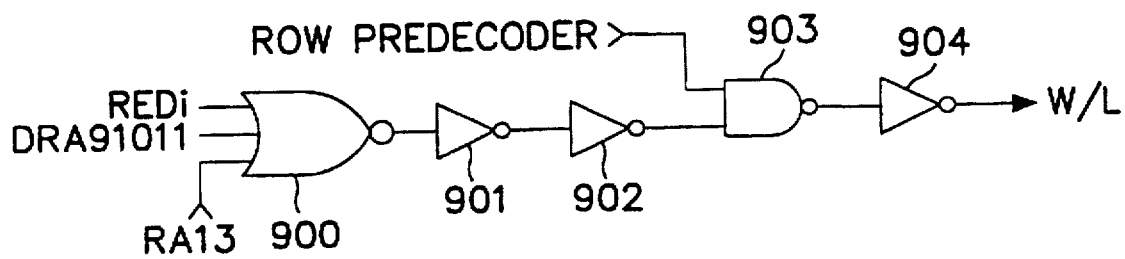

In FIG. 7, there are provided a three-input NAND gate 800, an invertor 801, a NAND gate 802, and an invertor 803. The invertor 801 inverts the output of the NAND gate 800. The NAND gate 802 receives an output from the invertor 801 and a decoding signal of the column predeceder 320 to thereby NAND the two input signals. The invertor 803 inverts an output of the NAND gate 802. In FIG. 8 there is provided a NOR gate 900, inverters 901 and 902, a NAND gate 903, and an invertor 904. The NOR gate 900 receives the signal REDi, a signal DRA91011, and the signal RA13 to thereby NOR the input signals. The inverters 901 and 902 double invert the output of the NOR gate 900. The NAND gate 903 receives an output from the invertor 902 and a decoding signal of the row predecoder 300 to thereby NAND the two input signals. The invertor 904 provides a word line signal by inverting an output of the NAND gate 903.

Thus, if the row and column addresses RA13 and CA13 are all applied to the memory cell at the logic "low" level, there is performed a test of the normal memory cell in cell array 400 of FIG. 4. That is, there is performed a test of the normal memory cells through the address CA13B from the address RA13B. Further, when the output of the row address RA13 is at the logic "high" level and that of the column address CA13 is at the logic "low" level, the redundancy memory cell test of the row part is performed. In the contrary case, when the output of the row address RA13 is at the logic "low" level and that of the column address CA13 is at the logic "high" level, the redundancy memory cell of the column part is performed.

As mentioned above, according to the present invention, the test of the redundancy memory cell is efficiently achieved in the same test mode, and utilizing the same addresses, as that of the normal memory cell. Moreover, since it is possible to simultaneously test the memory cells, the time required to complete this testing is reduced, as compared with the prior art.

Accordingly, the test implemented according to the present invention can be appropriately used in a dynamic memory from which data is output through the data output pins of the integrated circuit during a standardized parallel test.

We claim:

1. A memory cell test circuit for a semiconductor memory device having a memory cell array including a first array of normal memory cells addressable by a row decoder and a column decoder and a second array of redundant memory cells addressable by a row redundancy decoder and a column redundancy decoder, said memory test circuit comprising:

an address bus for applying row and column addresses comprising logic high and low levels to said memory device, said address bus including a bus line having a signal thereon for selecting between said row and column decoders when the signal on said line is in a first logic state and said row and column redundancy decoders when the signal on said line is in a second logic state; and a logic circuit for applying addresses on said bus to said row and column decoders when a signal on said bus line is in the first logic state and for applying addresses on said bus to said row and column redundancy decoders when the signal is in the second logic state, said bus line being operatively connected to said logic circuit.

2. The circuit of claim 1 wherein said address bus is operatively connected to a row address buffer and to a column address buffer.

3. The circuit of claim 2 wherein said bus line is operatively connected to a second row address buffer and a second column address buffer for storing the logic state of said signal during a test of the cells in said arrays.

4. The circuit of claim 3 wherein said row address buffers are connected to a row redundancy fuse box and said column address buffers are connected to a column redundancy fuse box.

5. A method of testing a memory cell test circuit for a semiconductor memory device having a memory cell array including a first array of normal memory cells and a second array of redundant memory cells, said method comprising:

sequentially applying row and column addresses to a bus connected to said arrays;

applying said addresses to said first array when said signal the most significant bit of said address is in a first logic state; and applying said addresses to said second array when the most significant bit of said address is in a second logic state.

6. The method of claim 5 wherein said method further includes the step of storing all but the most significant bit of the row address in a row address buffer and storing all but the most significant bit of the column address in a column address buffer.

7. The method of claim 6 wherein said method further includes:

storing the most significant bit of the address in a second column row address buffer;

storing the most significant bit of the address in a second column address buffer.

8. The method of claim 7 wherein said method further includes:

supplying the signal stored in said second row address buffer to a row redundancy fuse box; and supplying the signal stored in said second row column buffer to a column redundancy fuse box.

9. The method of claim 7 wherein said method further includes:

applying addresses from the row address buffer to said first array when the signal stored in said second row address buffer is in a first state; and applying addresses from the row address buffer to said second array when the signal stored in said second row address buffer is in a second state.

10. The method of claim 9 wherein said method further includes:

applying addresses from the column address buffer to said first array when the signal stored in said second column address buffer is in a first state; and applying addresses from the column address buffer to said second array when the signal stored in said second column address buffer is in a second state.

* * * * *

UNITED STATES PATENT AND TRADEMARK OFFICE
CERTIFICATE OF CORRECTION

PATENT NO. : 5,732,029
DATED : March 24, 1998
INVENTOR(S) : Sang-Kil Lee et al.

It is certified that error appears in the above-identified patent and that said Letters Patent is hereby corrected as shown below:

Column 6,
Line 53, "when said signal the" should read -- when the said signal --;

Column 5,
Line 44, "predeceder" should read -- predecoder --.

Signed and Sealed this

Twenty-first Day of May, 2002

Attest:

Attesting Officer

JAMES E. ROGAN
Director of the United States Patent and Trademark Office